United States Patent
Lee et al.

(10) Patent No.: US 11,799,497 B2
(45) Date of Patent: Oct. 24, 2023

(54) STORAGE DEVICE INCLUDING STORAGE CONTROLLER AND METHOD FOR OPERATING STORAGE CONTROLLER

(71) Applicant: Samsung Electronics Co., Ltd., Suwon-si (KR)

(72) Inventors: Jeong Woo Lee, Suwon-si (KR); Sang Jin Yoo, Pocheon-si (KR); Hee-Woong Kang, Suwon-si (KR); Kwang Woo Lee, Seoul (KR); Hee Won Lee, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/744,635

(22) Filed: May 14, 2022

(65) Prior Publication Data

US 2023/0064060 A1 Mar. 2, 2023

(30) Foreign Application Priority Data

Aug. 25, 2021 (KR) .................. 10-2021-0112370

(51) Int. Cl.
*H03M 13/00* (2006.01)
*H03M 13/11* (2006.01)
(Continued)

(52) U.S. Cl.
CPC ....... *H03M 13/1111* (2013.01); *G11C 7/1039* (2013.01); *G11C 29/52* (2013.01); *H03M 13/1151* (2013.01)

(58) Field of Classification Search
CPC ........... H03M 13/1111; H03M 13/1151; G11C 7/1039; G11C 29/52
See application file for complete search history.

(56) References Cited

U.S. PATENT DOCUMENTS 9,405,624 B2 * 8/2016 Alhussien ......... H03M 13/2909
9,934,087 B2 * 4/2018 Hsiao .................... G11C 29/36
(Continued)

FOREIGN PATENT DOCUMENTS

KR 20150121835 A 10/2015
KR 20160102738 A 8/2016
(Continued)

OTHER PUBLICATIONS

European Search Report dated Nov. 10, 2022 for corresponding European Patent application EP 22 173 472.6.
(Continued)

*Primary Examiner* — Esaw T Abraham
(74) *Attorney, Agent, or Firm* — Muir Patent Law, PLLC

(57) ABSTRACT

A method for operating a storage controller includes receiving a first read command, performing a first read of data stored in a nonvolatile memory using a first read level and receiving a first read data, performing first error correction decoding of the first read data to determine whether the first error correction decoding succeeds, determining a second read level using a predetermined method, and determining a first soft decision offset value of the second read level, reading data stored in the nonvolatile memory using the determined second read level and the first soft decision offset value and receiving a first soft decision data, performing second error correction decoding of the first soft decision data to determine whether the second error correction decoding succeeds, and storing the second read level, a first method used to determine the second read level and the first soft decision offset value.

20 Claims, 13 Drawing Sheets

(51) Int. Cl.
  *G11C 7/10* (2006.01)
  *G11C 29/52* (2006.01)

(56) References Cited

U.S. PATENT DOCUMENTS

| | | | |
|---|---|---|---|
| 10,061,640 B1 | 8/2018 | Lu et al. | |
| 10,083,754 B1* | 9/2018 | Chen | G11C 7/1006 |
| 10,175,892 B1 | 1/2019 | Kim et al. | |
| 10,263,639 B2 | 4/2019 | Li | |
| 10,275,297 B2 | 4/2019 | Lee et al. | |
| 10,417,087 B2* | 9/2019 | Lu | G06F 11/1012 |
| 10,763,898 B2 | 9/2020 | Haga | |
| 10,778,258 B2 | 9/2020 | Watanabe | |
| 10,943,634 B2* | 3/2021 | Jung | G11C 11/5642 |
| 11,231,994 B2* | 1/2022 | Kumano | H03M 13/2906 |
| 11,245,420 B2* | 2/2022 | Kim | H03M 13/1111 |
| 2015/0095741 A1 | 4/2015 | Lin et al. | |
| 2019/0068222 A1 | 2/2019 | Lee | |
| 2019/0287640 A1* | 9/2019 | Takahashi | G11C 29/52 |
| 2020/0042237 A1 | 2/2020 | Zeng et al. | |
| 2021/0005242 A1 | 1/2021 | Kim | |

FOREIGN PATENT DOCUMENTS

| | | |
|---|---|---|
| KR | 20180042974 A | 4/2018 |
| KR | 20180128235 A | 12/2018 |
| KR | 20200117244 A | 10/2020 |

OTHER PUBLICATIONS

First Office Action dated Nov. 22, 2022 for corresponding European Patent application EP 22 173 472.6.

* cited by examiner

STORAGE DEVICE INCLUDING STORAGE CONTROLLER AND METHOD FOR OPERATING STORAGE CONTROLLER

CROSS-REFERENCE TO RELATED APPLICATION(S)

This application claims priority under 35 U.S.C. § 119 to Korean Patent Application No. 10-2021-0112370 filed on Aug. 25, 2021 in the Korean Intellectual Property Office, the disclosure of which is incorporated herein by reference in its entirety.

BACKGROUND

1. Field

The present invention relates to a storage device and a method for operating a storage controller.

2. Description of the Related Art

In a nonvolatile memory including a NAND flash, while data is programmed to a memory cell, a cell distribution is formed. When a read operation is performed using a read level suitable for the form of cell distribution, reliable read data may be obtained.

However, such cell distribution may deteriorate while the operation of the nonvolatile memory continues. In this case, when the read operation is performed at an existing read level defined in advance, data including many errors may be more likely to be obtained. Accordingly, it is desired that a new read level corresponding to a current cell distribution is determined.

When there is an error in the read data, a defense operation or a recovery operation may be performed to obtain an optimum read level, and the data may be acquired through a read retry operation. However, as the deterioration of cell distribution becomes severe, it is difficult to acquire reliable read data simply by finding the optimum read level. Therefore, error correction decoding may be performed, by utilizing the soft decoding of an error correction code (ECC) engine. At this time, soft decision data needs to be generated and then input to the ECC engine for soft decoding.

In order to generate such soft decision data, a soft decision offset value is required. However, because a plurality of read operations may be required again in the process of determining the soft decision offset value, an operating speed of a storage device may decrease.

SUMMARY

Aspects of the present invention provide a method for operating a storage controller capable of improving the operating speed of the storage device.

Aspects of the present invention also provide a storage device having an improved operating speed.

According to some aspects of the present disclosure, there is provided a method for operating a storage controller, the method includes receiving a first read command from a host device, when the first read command is received, performing a first read of data stored in a nonvolatile memory using a first read level and receiving a first read data from the nonvolatile memory on the basis of a result of the first read, performing first error correction decoding of the first read data to determine whether the first error correction decoding succeeds, when the first error correction decoding is failed, determining a second read level different from the first read level using at least one of predetermined methods, and determining a first soft decision offset value of the second read level, performing a second read of the data stored in the nonvolatile memory using the determined second read level and the first soft decision offset value and receiving a first soft decision data from the nonvolatile memory on the basis of a result of the second read, performing second error correction decoding of the first soft decision data to determine whether the second error correction decoding succeeds, and when the second error correction decoding is succeeded, storing the second read level, a first method of the predetermined methods used to determine the second read level and the first soft decision offset value as a history log.

According to some aspects of the present disclosure, there is provided a method for operating a storage controller, the method includes receiving a first read command from a host device, when the first read command is received, performing a first read of data stored in a nonvolatile memory using a first read level and receiving a first read data, from the nonvolatile memory, performing first error correction decoding of the first read data to determine whether the first error correction decoding succeeds, when the first error correction decoding is failed, checking whether a first method of predetermined methods for determining a second read level different from the first read level, and a first soft decision offset value of the second read level are stored as a history log, when the history log exists, performing a second read of the data stored in the nonvolatile memory using the determined second read level and the first soft decision offset value of the history log to receive a first soft decision data from the nonvolatile memory on the basis of a result of the second read, and when the history log does not exist, determining a third read level different from the first read level using at least one of the predetermined methods and determining a second soft decision offset value of the third read level, and performing a third read of the data stored in the nonvolatile memory using the determined third read level and the second soft decision offset value to receive a second soft decision data.

According to some aspects of the present disclosure, there is provided a storage device includes a nonvolatile memory, and a storage controller which includes a buffer memory, and controls an operation of the nonvolatile memory. The storage controller is configured to receive a first read command from a host device, in response to the first read command, perform a first read of data stored in the nonvolatile memory using a first read level and receive a first read data from the nonvolatile memory on the basis of a result of the first read, perform error correction decoding of the first read data to determine whether the error correction decoding succeeds, in response to failure of the error correction decoding, check whether a first method of predetermined methods for determining a second read level different from the first read level, and a first soft decision offset value of the second read level are stored as a history log, in response to existing the history log, perform a second read of the data stored in the nonvolatile memory using the determined second read level and the first soft decision offset value to receive a first soft decision data from the nonvolatile memory on the basis of a result of the second read, and in response to not existing the history log, determine a third read level different from the first read level using at least one of the predetermined methods and determine a second soft decision offset value of the third read level, and perform a third read of the data stored in the nonvolatile memory using the determined third read level and the second soft decision offset value to receive a second soft decision data from the nonvolatile memory on the basis of a result of the third read.

BRIEF DESCRIPTION OF THE DRAWINGS

The above and other aspects and features of the present invention will become more apparent by describing in detail exemplary embodiments thereof referring to the attached drawings, in which.

DETAILED DESCRIPTION OF THE EMBODIMENTS

Embodiments according to the technical idea of the present invention will be described below referring to the accompanying drawings.

Figure 1:
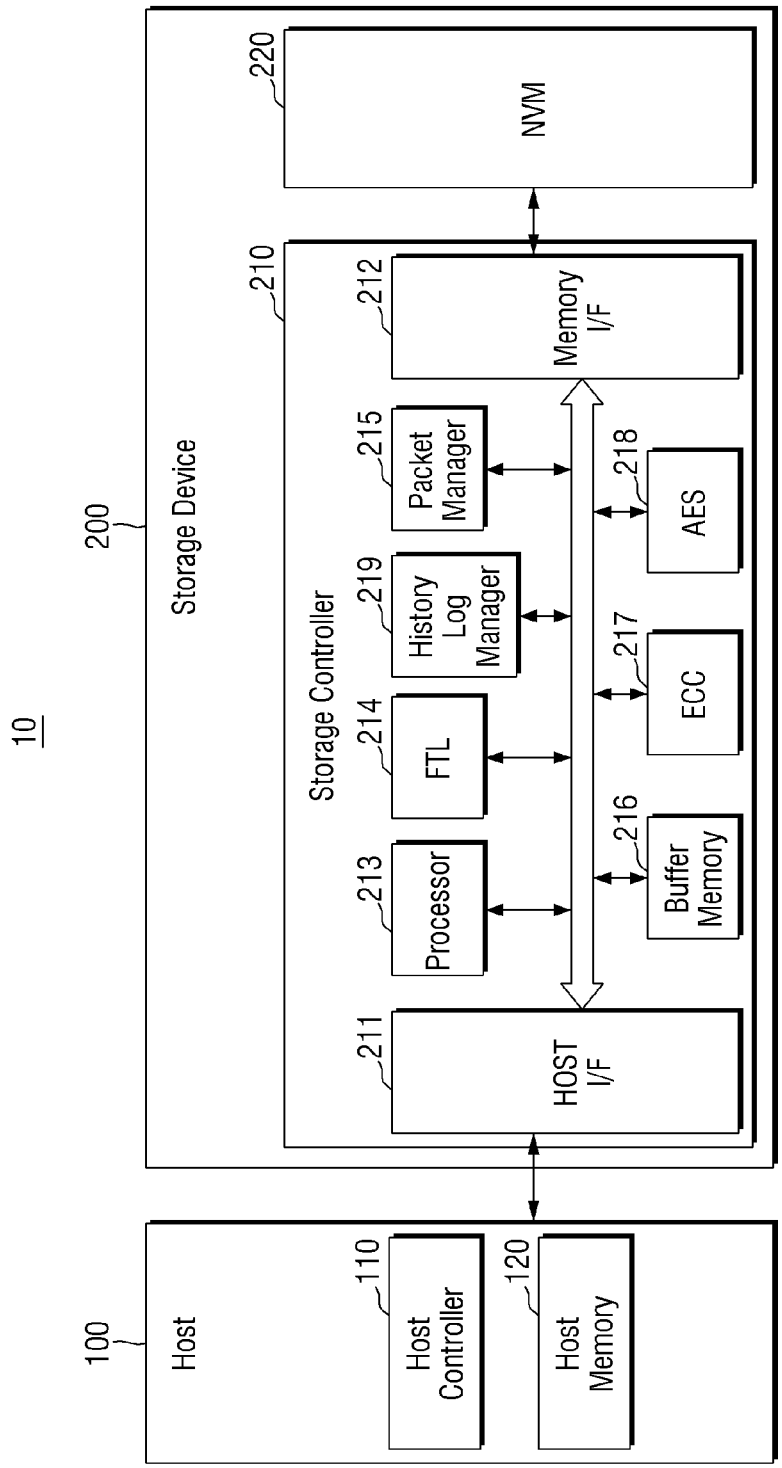
FIG. 1 is a block diagram which shows a memory system according to some embodiments.
Figure 2:
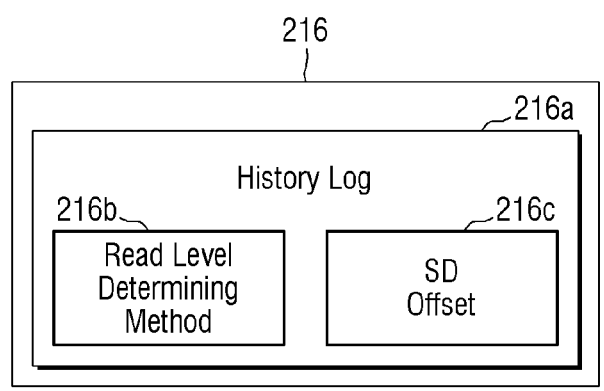
FIG. 2 is a diagram showing a buffer memory of FIG. 1 according to example embodiments.
Figure 3:
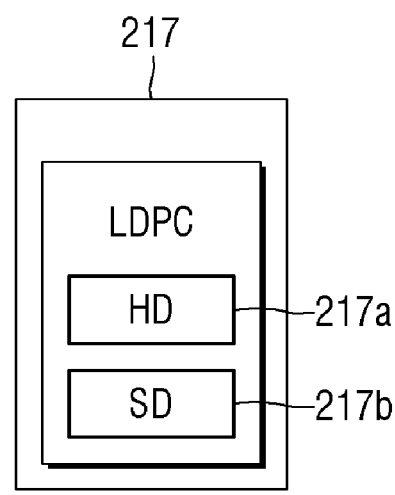
FIG. 3 is a diagram showing an ECC engine of FIG. 1 according to example embodiments.

FIG. 1 is a block diagram which shows a memory system according to some embodiments. FIG. 2 is a diagram showing a buffer memory of FIG. 1 according to example embodiments. FIG. 3 is a diagram showing an ECC engine of FIG. 1 according to example embodiments.

Referring to FIG. 1, a memory system 10 may include a host device 100 and a storage device 200. The storage device 200 may include a storage controller 210 and a nonvolatile memory (NVM) 220. The host device 100 may include a host controller 110 and a host memory 120. The host memory 120 may function as a buffer memory for temporarily storing the data to be transferred to the storage device 200 or the data transferred from the storage device 200.

The storage device 200 may include storage medium for storing data in response to a request from the host device 100. For example, the storage device 200 may include at least one of a solid state drive (SSD), an embedded memory, and a detachable external memory. When the storage device 200 is the SSD, the storage device 200 may be, for example, a device that complies with a non-volatility memory express (NVMe) standard.

When the storage device 200 is an embedded memory or an external memory, the storage device 200 may be a device that complies with a universal flash storage (UFS) or an embedded multi-media card (eMMC) standard. The host device 100 and the storage device 200 may each generate and transmit packets according to the adopted standard protocol.

When the nonvolatile memory 220 of the storage device 200 includes a flash memory, the flash memory may include a 2D NAND memory array or a 3D (or vertical) NAND (VNAND) memory array. As another example, the storage device 200 may include different various types of nonvolatile memories. For example, the storage device 200 may include a magnetic random access memory (MRAM), a spin-transfer torque MRAM, a conductive bridging RAM (CBRAM), a ferroelectric RAM (FeRAM), a phase RAM (PRAM), a resistive memory (Resistive RAM), and various other types of memories.

In some embodiments, the host controller 110 and the host memory 120 may be implemented as separate semiconductor chips. Further, in some embodiments, the host controller 110 and the host memory 120 may be integrated on the same semiconductor chip. As an example, the host controller 110 may be one of a plurality of modules provided in the application processor, and such an application processor may be implemented as a system on chip (SoC). Further, the host memory 120 may be an embedded memory provided inside the application processor, or a nonvolatile memory or a memory module placed outside the application processor.

The host controller 110 may manage an operation of storing the data (for example, write data) of a buffer region in the nonvolatile memory 220 or storing the data (for example, read data) of the nonvolatile memory 220 in the buffer region.

The storage controller 210 may include a host interface 211, a memory interface 212, and a processor 213. Also, the storage controller 210 may further include a flash translation layer (FTL) 214, a packet manager 215, a buffer memory 216, an error correction code (ECC) engine 217, and an advanced encryption standard (AES) engine 218.

The storage controller 210 may further include a working memory (not shown) into which the flash translation layer (FTL) 214 is loaded, and when the processor 213 executes the flash translation layer 214, the data write and read operations of the nonvolatile memory 220 may be controlled.

The host interface 211 may transmit and receive packets to and from the host device 100. The packets transmitted from the host device 100 to the host interface 211 may include a command, data to be written in the nonvolatile memory 220, or the like. The packets transmitted from the host interface 211 to the host device 100 may include a response to the command, data that is read from the nonvolatile memory 220 or the like.

The memory interface 212 may transmit the data to be written in the nonvolatile memory 220 to the nonvolatile memory 220 or receive the data that is read from the nonvolatile memory 220. Such a memory interface 212 may be implemented to comply with standard protocols such as Toggle or ONFI.

The flash translation layer 214 may perform various functions such as address mapping, wear-leveling, and garbage collection. The address mapping operation is an operation of changing a logical address received from a host into a physical address which is used for actually storing the data in the nonvolatile memory 220. The wear-leveling is a technique for ensuring that blocks in the nonvolatile memory 220 are used uniformly to prevent an excessive degradation of a particular block, and may be implemented, for example, through a firmware technique for balancing the erasure counts of the physical blocks. The garbage collection is a technique for ensuring an available capacity in the nonvolatile memory 220 through a method of copying the valid data of the block to a new block and then erasing the existing block.

The packet manager 215 may generate a packet according to the protocol of the interface discussed with the host device 100, or may parse various types of information from the packet received from the host device 100.

The buffer memory 216 may temporarily store the data to be written in the nonvolatile memory 220 or the data to be read from the nonvolatile memory 220. The buffer memory 216 may be configured to be provided inside the storage controller 210, but may be placed outside the storage controller 210.

In the present embodiment, the buffer memory 216 may store a history log 216a as shown in FIG. 2. The history log 216a may include a read level, a read level determining method (or read level determining scheme) 216b and a soft decision offset value 216c of the read level.

The read level determining method 216b is a method which is used by the storage controller 210 to determine the read level for reading the data stored in the nonvolatile memory 220 in response to the read command immediately provided from the host device 100. That is, the read level determining method is a read level searching method selected in consideration of current cell distribution information of the nonvolatile memory 220. Herein, the current cell distribution information may not be predetermined and may be different from each of nonvolatile memories.

The soft decision offset value 216c is a soft decision offset value which is used by the storage controller 210 to read the data stored in the nonvolatile memory 220 in response to the read command immediately provided from the host device 100. A specific description of the read level determining method 216b and the soft decision offset value 216c will be described later.

The ECC engine 217 may perform error detection and correction functions on the read data that is read from the nonvolatile memory 220. For example, the ECC engine 217 may generate parity bits for the write data to be written on the nonvolatile memory 220, and the parity bits thus generated may be stored in the nonvolatile memory 220 together with the write data. When reading the data from the nonvolatile memory 220, the ECC engine 217 may correct an error of the read data, using the parity bits that are read from the nonvolatile memory 220, together with the read data, and output the read data with a corrected error.

As shown in FIG. 3, the ECC engine 217 may perform error correction using, for example, a low density parity check (LDPC) code. For example, the ECC engine 217 may perform error correction decoding on the basis of a hard decision data 217a that is read from the nonvolatile memory 220, and may perform error correction decoding on the basis of a soft decision data 217b that is read from the nonvolatile memory 220. A specific description of the hard decision data 217a and the soft decision data 217b will be provided below referring to FIG. 15.

The ECC engine 217 may determine whether such error correction decoding succeed, and may output an instruction signal according to the determination result. However, there is a limit to the number of error bits that may be corrected by the ECC engine 217. An uncorrectable error correction code (UECC) error may occur, when the hard decision data 217a or the soft decision data 217b received by the ECC engine 217 has more error bits than the error bits that may be corrected by the ECC engine 217.

Although FIG. 3 shows an example in which the ECC engine 217 performs error correction using an LDPC code, the embodiments are not limited thereto. In some embodiments, the ECC engine 217 may perform the error correction, using coded modulation such as a bose-chaudhri-hocquenghem (BCH) code, turbo code, Reed-Solomon code, convolution code, recursive systematic code (RSC), trellis-coded modulation (TCM), and block coded modulation (BCM).

The AES engine 218 may perform at least one of encryption and decoding operations of the data which is input to the storage controller 210, using a symmetric-key algorithm.

The history log manager 219 may manage the above-mentioned history log (216a of FIG. 2). When the error correction decoding of the ECC engine 217 succeeds, the history log manager 219 may store the used read level determining method 216b and the soft decision offset value 216c in the buffer memory 216.

In some embodiments, the history log manager 219 may be implemented in software and may be executed by the processor 213. However, the embodiments are not limited thereto, and the history log manager 219 may be implemented in hardware and included in the storage controller 210. The specific operation of the history log manager 219 will be described later.

Figure 4:
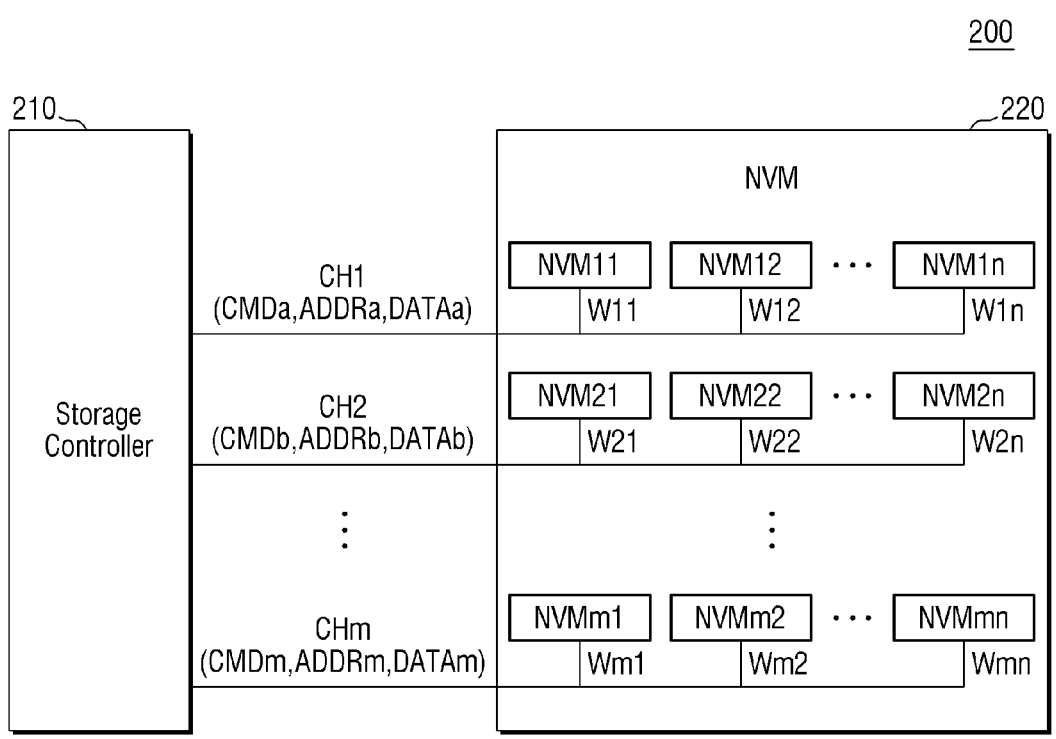
FIG. 4 is a diagram showing a storage controller and a nonvolatile memory of the storage device of FIG. 1 in a reconfigured manner, according to example embodiments.

FIG. 4 is a diagram in which the storage controller and the nonvolatile memory of the storage device of FIG. 1 are reconfigured, according to example embodiments.

Referring to FIG. 4, the storage device 200 may include a nonvolatile memory 220 and a storage controller 210. The storage device 200 may support a plurality of channels CH1 to CHm, and the nonvolatile memory 220 and the storage controller 210 may be connected through the plurality of channels CH1 to CHm. Herein, m is a natural number greater than 1. For example, the storage device 200 may be implemented by a storage device such as an SSD.

The nonvolatile memory 220 may include a plurality of nonvolatile memory devices NVM11 to NVM1n, NVM21 to NVM2n, . . . , and NVMm1 to NVMmn. Herein, n is a natural number greater than 1. Each of the nonvolatile memory devices NVM11 to NVM1n, NVM21 to NVM2n, . . . , and NVMm1 to NVMmn may be connected to one of the plurality of channels CH1 to CHm through corresponding way. For example, the nonvolatile memory devices NVM11 to NVM1n are connected to a first channel CH1 through the ways W11 to W1n, and the nonvolatile memory devices NVM21 to NVM2n may be connected to a second channel CH2 through the ways W21 to W2n. In an exemplary embodiment, each of the nonvolatile memory devices NVM11 to NVM1n, NVM21 to NVM2n, . . . , and NVMm1 to NVMmn may be implemented in an arbitrary memory unit that may operate according to individual instructions from the storage controller 210. For example, although each of the nonvolatile memory devices NVM11 to NVM1n, NVM21 to NVM2n, . . . , and NVMm1 to NVMmn may be implemented as a chip or a die, the present invention is not limited thereto.

The storage controller 210 may transmit and receive signals to and from the nonvolatile memory 220 through the plurality of channels CH1 to CHm. For example, the storage controller 210 may transmit commands CMDa to CMDm, addresses ADDRa to ADDRm, and data DATAa to DATAm to the nonvolatile memory 220 through the channels CH1 to CHm, or may receive the data DATAa to DATAm from the nonvolatile memory 220.

The storage controller 210 may select one of the nonvolatile memory devices connected to the channel through each channel, and may transmit and receive signals to and from the selected nonvolatile memory device. For example, the storage controller 210 may select the nonvolatile memory device NVM11 among the nonvolatile memory devices NVM11 to NVM1n connected to the first channel CH1. The storage controller 210 may transmit command CMDa, address ADDRa, and data DATAa to the selected nonvolatile memory device NVM11 through the first channel CH1, or may receive the data DATAa from the selected nonvolatile memory device NVM11.

The storage controller 210 may transmit and receive signals in parallel to and from the nonvolatile memory 220 through different channels from each other. For example, the storage controller 210 may transmit a command CMDb to the nonvolatile memory 220 through the second channel CH2, while transmitting the command CMDa to the nonvolatile memory 220 through the first channel CH1. For example, the storage controller 210 may receive the data DATAb from the nonvolatile memory 220 through the second channel CH2, while receiving the data DATAa from the nonvolatile memory 220 through the first channel CH1.

The storage controller 210 may control the overall operation of the nonvolatile memory 220. The storage controller 210 may transmit the signal to the channels CH1 to CHm to control each of the nonvolatile memory devices NVM11 to NVM1n, NVM21 to NVM2n, . . . , and NVMm1 to NVMmn connected to the channels CH1 to CHm. For example, the storage controller 210 may transmit the command CMDa and the address ADDRa to the first channel CH1 to control selected one among the nonvolatile memory devices NVM11 to NVM1n.

Each of the nonvolatile memory devices NVM11 to NVM1n, NVM21 to NVM2n, . . . , and NVMm1 to NVMmn may operate according to the control of the storage controller 210. For example, the nonvolatile memory device NVM11 may program (or write) the data DATAa in accordance with the command CMDa, the address ADDRa, and the data DATAa provided to the first channel CH1. For example, the nonvolatile memory device NVM21 may read the data DATAb in accordance with the command CMDb and the address ADDRb provided to the second channel CH2, and transmit the read data DATAb to the storage controller 210 through the second channel CH2.

Although FIG. 4 shows that the nonvolatile memory 220 communicates with the storage controller 210 through m channels, and the nonvolatile memory 220 includes n nonvolatile memory devices corresponding to each channel, the number of channels and the number of nonvolatile memory devices connected to one channel may be variously changed.

Figure 5:
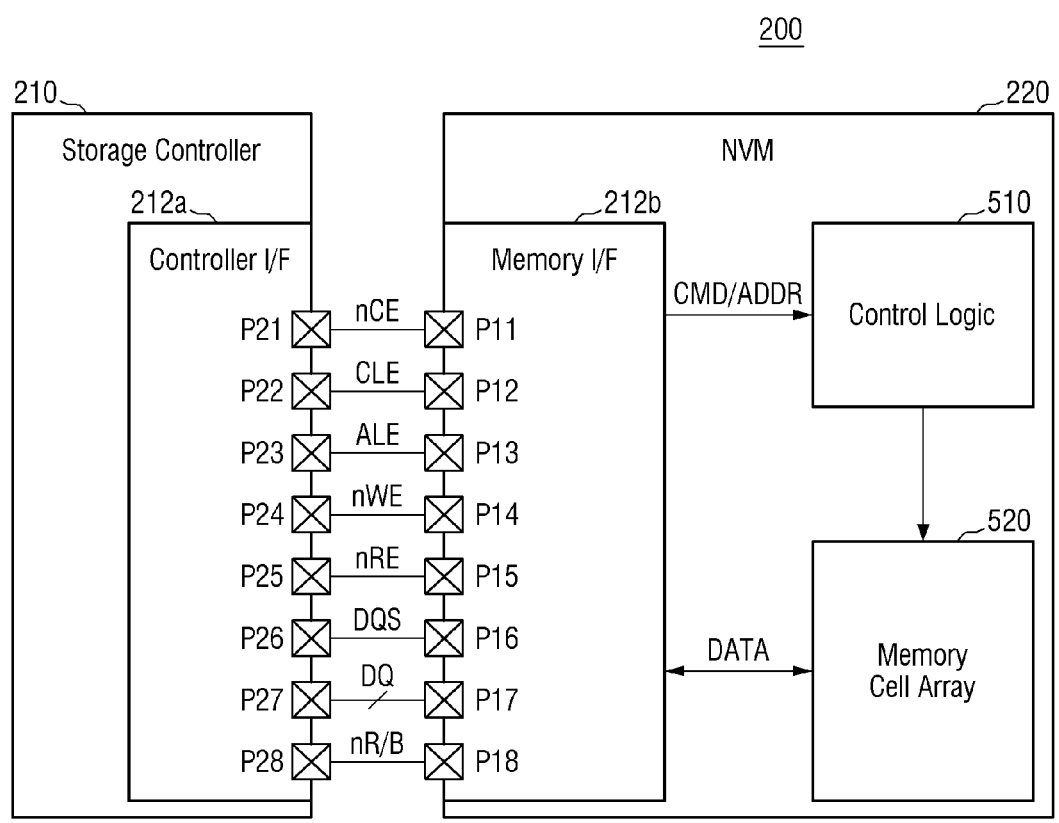
FIG. 5 is a diagram showing the storage controller, the memory interface, and the nonvolatile memory of FIG. 1 in a reconfigured manner, according to example embodiments.

FIG. 5 is a diagram showing the storage controller, the memory interface, and the nonvolatile memory of FIG. 1 in a reconfigured manner, according to example embodiments.

Referring to FIG. 5, the storage device 200 may include a nonvolatile memory 220 and a storage controller 210. The nonvolatile memory 220 of FIG. 5 may correspond to one of the plurality of nonvolatile memory devices NVM11 to NVM1n, NVM21 to NVM2n, . . . , and NVMm1 to NVMmn of FIG. 4. The memory interface 212 of FIG. 1 may include a controller interface circuit 212a of FIG. 5.

The nonvolatile memory 220 may include first to eighth pins P11 to P18, a memory interface circuit 212b, a control logic circuit 510, and a memory cell array 520.

The nonvolatile memory 220 and the storage controller 210 may be connected through the controller interface circuit 212a and the memory interface circuit 212b.

The memory interface circuit 212b may receive a chip enable signal nCE from the storage controller 210 through a first pin P11. The memory interface circuit 212b may transmit and receive signals to and from the storage controller 210 through second to eighth pins P12 to P18 according to the chip enable signal nCE. For example, when the chip enable signal nCE is in an enable state (e.g., a low level), the memory interface circuit 212b may transmit and receive signals to and from the storage controller 210 through the second to eighth pins P12 to P18.

The memory interface circuit 212b may receive a command latch enable signal CLE, an address latch enable signal ALE, and a write enable signal nWE from the storage controller 210 through second to fourth pins P12 to P14. The memory interface circuit 212b may receive a data signal DQ from the storage controller 210 or transmit the data signal DQ to the storage controller 210 through a seventh pin P17. The command CMD, the address ADDR, and the data DATA may be transferred through the data signal DQ. For example, the data signal DQ may be transferred through a plurality of data signal lines. In this case, the seventh pin P17 may include a plurality of pins corresponding to the plurality of data signals.

The memory interface circuit 212b may acquire the command CMD from the data signal DQ received in an enable section (e.g., a high level state) of the command latch enable signal CLE on the basis of the toggle timings of the write enable signal nWE. The memory interface circuit 212b may acquire the address ADDR from the data signal DQ received in the enable section (e.g., a high level state) of the address latch enable signal ALE on the basis of the toggle timings of the write enable signal nWE.

In some embodiments, the write enable signal nWE holds a static state (e.g., a high level or a low level) and then may be toggled between the high level and the low level. For example, the write enable signal nWE may be toggled at the section in which the command CMD or the address ADDR is transmitted. Accordingly, the memory interface circuit 212b may acquire the command CMD or the address ADDR on the basis of the toggle timings of the write enable signal nWE.

The memory interface circuit 212b may receive a read enable signal nRE from the storage controller 210 through a fifth pin P15. The memory interface circuit 212b may receive the data strobe signal DQS from the storage controller 210 through a sixth pin P16, or may transmit the data strobe signal DQS to the storage controller 210.

In a data DATA output operation of the nonvolatile memory 220, the memory interface circuit 212b may receive the toggled read enable signal nRE through the fifth pin P15 before output of the data DATA. The memory interface circuit 212b may generate the toggled data strobe signal DQS on the basis of toggling of the read enable signal nRE. For example, the memory interface circuit 212b may generate the data strobe signal DQS that starts to toggle after a predetermined delay (e.g., tDQSRE) on the basis of the toggling start time of the read enable signal nRE. The memory interface circuit 212b may transmit a data signal DQ including the data DATA on the basis of the toggle timing of the data strobe signal DQS. Accordingly, the data DATA may be arranged at the toggle timing of the data strobe signal DQS and transmitted to the storage controller 210.

In a data DATA input operation of the nonvolatile memory 220, when the data signal DQ including the data DATA is received from the storage controller 210, the memory interface circuit 212b may receive the toggled data strobe signal DQS together with the data DATA from the storage controller 210. The memory interface circuit 212b may acquire the data DATA from the data signal DQ, on the basis of the toggle timing of the data strobe signal DQS. For example, the memory interface circuit 212b may acquire the data DATA, by sampling the data signal DQ at a rising edge and/or a falling edge of the data strobe signal DQS.

The memory interface circuit 212b may transmit a ready/busy output signal nR/B to the storage controller 210 through an eighth pin P18. The memory interface circuit 212b may transmit the state information of the nonvolatile memory 220 to the storage controller 210 such as the ready/busy output signal nR/B. When the nonvolatile memory 220 is in a busy state (that is, when the internal operations of the nonvolatile memory 220 are being performed), the memory interface circuit 212b may transmit the ready/busy output signal nR/B indicating the busy state to the storage controller 210. When the nonvolatile memory 220 is in a ready state (i.e., the internal operations of the nonvolatile memory 220 are not performed or are completed), the memory interface circuit 212b may transmit the ready/busy output signal nR/B indicating the ready state to the storage controller 210.

For example, while the nonvolatile memory 220 reads the data DATA from the memory cell array 520 in response to a page read command, the memory interface circuit 212b may transmit the ready/busy output signal nR/B indicating the busy state (e.g., a low level) to the storage controller 210. For example, while the nonvolatile memory 220 programs the data DATA into the memory cell array 520 in response to a program instruction, the memory interface circuit 212b may transmit the ready/busy output signal nR/B indicating the busy state to the storage controller 210.

The control logic circuit 510 may generally control various operations of the nonvolatile memory 220. The control logic circuit 510 may receive the command/address CMD/ADDR acquired from the memory interface circuit 212b. The control logic circuit 510 may generate control signals for controlling other constituent elements of the nonvolatile memory 220 according to the received command/address CMD/ADDR. For example, the control logic circuit 510 may generate various control signals for programing the data DATA in the memory cell array 520 or reading the data DATA from the memory cell array 520

The memory cell array 520 may store the data DATA acquired from the memory interface circuit 212b according to the control of the control logic circuit 510. The memory cell array 520 may output the stored data DATA to the memory interface circuit 212b according to the control of the control logic circuit 510.

The memory cell array 520 may include a plurality of memory cells. For example, the plurality of memory cells may be flash memory cells. However, the present invention is not limited thereto, and each of the memory cells may be a resistive RAM (RRAM) cell, a ferroelectric RAM (FRAM) cell, a phase change RAM (PRAM) cell, a thyristor RAM (TRAM) cell, and a magnetic RAM (MRAM) cell. Hereinafter, embodiments of the present invention will be described on the basis of an embodiment in which the memory cells are the NAND flash memory cells.

The storage controller 210 may include first to eighth pins P21 to P28, and the controller interface circuit 212a. The first to eighth pins P21 to P28 may correspond to the first to eighth pins P11 to P18 of the nonvolatile memory 220.

The controller interface circuit 212a may transmit the chip enable signal nCE to the nonvolatile memory 220 through a first pin P21. The controller interface circuit 212a may transmit and receive signals to and from the nonvolatile memory 220, which is selected through the chip enable signal nCE, through the second to eighth pins P22 to P28.

The controller interface circuit 212a may transmit the command latch enable signal CLE, the address latch enable signal ALE, and the write enable signal nWE to the nonvolatile memory 220 through the second to fourth pins P22 to P24. The controller interface circuit 212a may transmit the data signal DQ to the nonvolatile memory 220 through a seventh pin P27 or receive the data signal DQ from the nonvolatile memory 220.

The controller interface circuit 212a may transmit the data signal DQ including the command CMD or the address ADDR, along with a toggled write enable signal, to the nonvolatile memory 220. The controller interface circuit 212a may transmit the data signal DQ including the command CMD to the nonvolatile memory 220 by transmitting the command latch enable signal CLE having the enable state, and may transmit the data signal DQ including the address ADDR to the nonvolatile memory 220 by transmitting the address latch enable signal ALE having the enable state.

The controller interface circuit 212a may transmit the read enable signal nRE to the nonvolatile memory 220 through a fifth pin P25. The controller interface circuit 212a may receive the data strobe signal DQS from the nonvolatile memory 220 through a sixth pin P26, or may transmit the data strobe signal DQS to the nonvolatile memory 220.

In the data DATA output operation of the nonvolatile memory 220, the controller interface circuit 212a may generate a toggled read enable signal nRE and transmit the read enable signal nRE to the nonvolatile memory 220. For example, the controller interface circuit 212a may generate the read enable signal nRE that changes from the static state (e.g., a high level or a low level) to the toggle state before the data DATA is output. Accordingly, the toggled data strobe signal DQS may be generated in the nonvolatile memory 220 on the basis of the read enable signal nRE. The controller interface circuit 212a may receive the data signal DQ including the data DATA together with the toggled data strobe signal DQS, from the nonvolatile memory 220. The controller interface circuit 212a may acquire the data DATA from the data signal DQ on the basis of the toggle timing of the data strobe signal DQS.

In the data DATA input operation of the nonvolatile memory 220, the controller interface circuit 212a may generate a toggled data strobe signal DQS. For example, the controller interface circuit 212a may generate a data strobe signal DQS that changes from the static state (e.g., a high level or a low level) to the toggle state before transmitting the data DATA. The controller interface circuit 212a may transmit the data signal DQ including the data DATA to the nonvolatile memory 220 on the basis of the toggle timings of the data strobe signal DQS.

The controller interface circuit 212a may receive a ready/busy output signal nR/B from the nonvolatile memory 220 through an eighth pin P28. The controller interface circuit 212a may discriminate the state information of the nonvolatile memory 220 on the basis of the ready/busy output signal nR/B.

Figure 6:
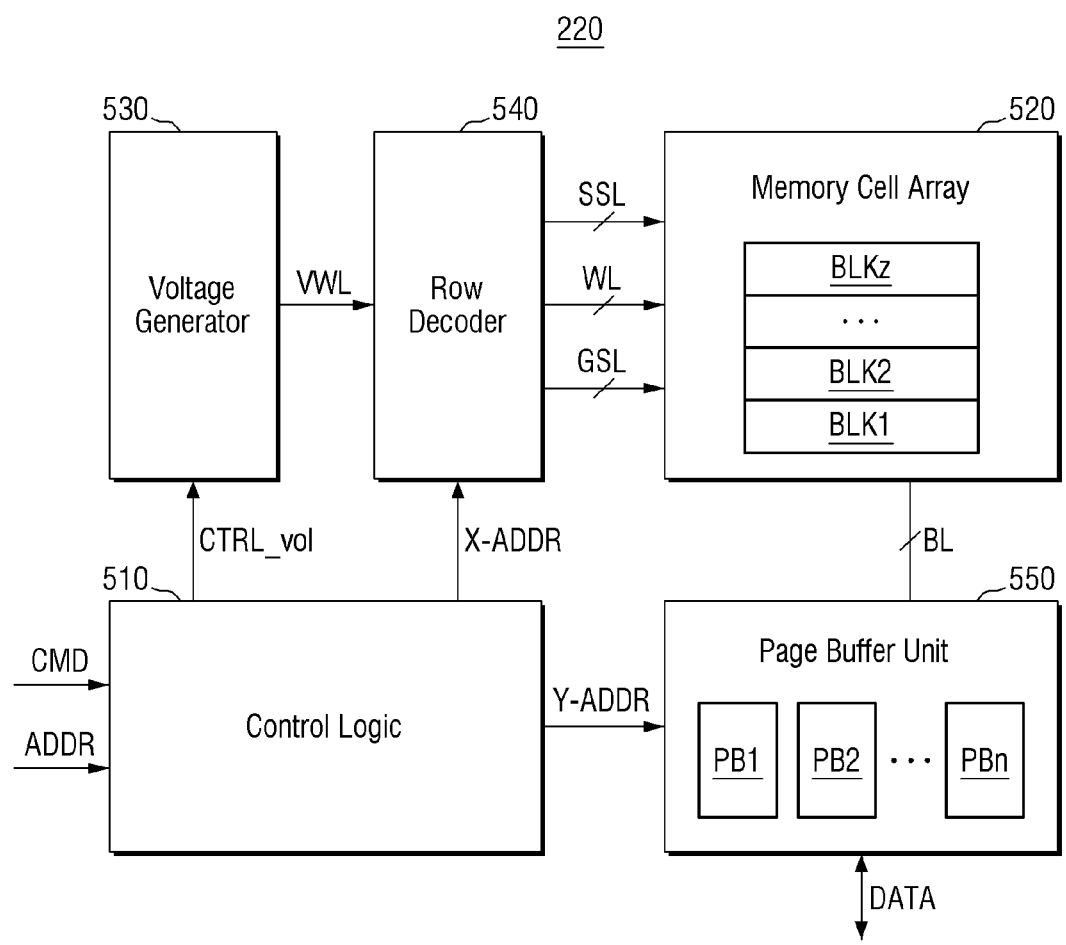
FIG. 6 is an exemplary block diagram showing the nonvolatile memory of FIG. 5 according to example embodiments.

FIG. 6 is an exemplary block diagram showing the nonvolatile memory of FIG. 5 according to example embodiments.

Referring to FIG. 6, the nonvolatile memory 220 may include a control logic circuit 510, a memory cell array 520, a page buffer unit 550, a voltage generator 530, and a row decoder 540. The nonvolatile memory 220 of FIG. 6 may correspond to one of the plurality of nonvolatile memory devices NVM11 to NVM1n, NVM21 to NVM2n, ..., and NVMm1 to NVMmn of FIG. 4. Although not shown in FIG. 6, the nonvolatile memory 220 may further include the memory interface circuit 212b shown in FIG. 5, and may further include a column logic, a pre-decoder, a temperature sensor, a command decoder, an address decoder, and the like.

The control logic circuit 510 may generally control various operations inside the nonvolatile memory 220. The control logic circuit 510 may output various control signals in response to the command CMD and/or the address ADDR from the memory interface circuit (212b of FIG. 5). For example, the control logic circuit 510 may output a voltage control signal CTRL_vol, a row address X-ADDR, and a column address Y-ADDR.

The memory cell array 520 may include a plurality of memory blocks BLK1 to BLKz (z is a natural number greater than 1), and each of the plurality of memory blocks BLK1 to BLKz may include a plurality of memory cells. The memory cell array 520 may be connected to the page buffer unit 550 through a plurality of bit lines BL, and may be connected to the row decoder 540 through word lines WL, string selection lines SSL, and ground selection lines GSL.

In an exemplary embodiment, the memory cell array 520 may include a three-dimensional memory cell array, and the three-dimensional memory cell array may include a plurality of NAND strings. Each NAND string may include memory cells which are each connected to word lines stacked vertically on the substrate. In an exemplary embodiment, the memory cell array 520 may include a two-dimensional memory cell array, and the two-dimensional memory cell array may include a plurality of NAND strings placed along row and column directions.

The page buffer unit 550 may include a plurality of page buffers PB1 to PBn (n is a natural number greater than 1), and each of the plurality of page buffers PB1 to PBn may be connected to the memory cells through the plurality of bit lines BL. The page buffer unit 550 may select at least one bit line among the bit lines BL in response to the column address Y-ADDR. The page buffer unit 550 may operate as an entry driver or a detection amplifier, depending on an operating mode of the nonvolatile memory 220. For example, at the time of the program operation, the page buffer unit 550 may apply a bit line voltage corresponding to the data to be programmed to the selected bit line. At the time of the read operation, the page buffer unit 550 may detect the current or voltage of the selected bit line and detect the data stored in the memory cell.

The voltage generator 530 may generate various types of voltages for performing program, read, and erasure operations on the basis of the voltage control signal CTRL_vol. For example, the voltage generator 530 may generate a program voltage, a read voltage, a program verification voltage, an erasure voltage, and the like, as a word line voltage VWL.

The row decoder 540 may select one of a plurality of word lines WL in response to the row address X-ADDR, and select one of a plurality of string selection lines SSL. For example, the row decoder 540 may apply a program voltage and a program verification voltage to the selected word line at the time of the program operation, and may apply a read voltage to the selected word line at the time of the read operation.

Figure 7:
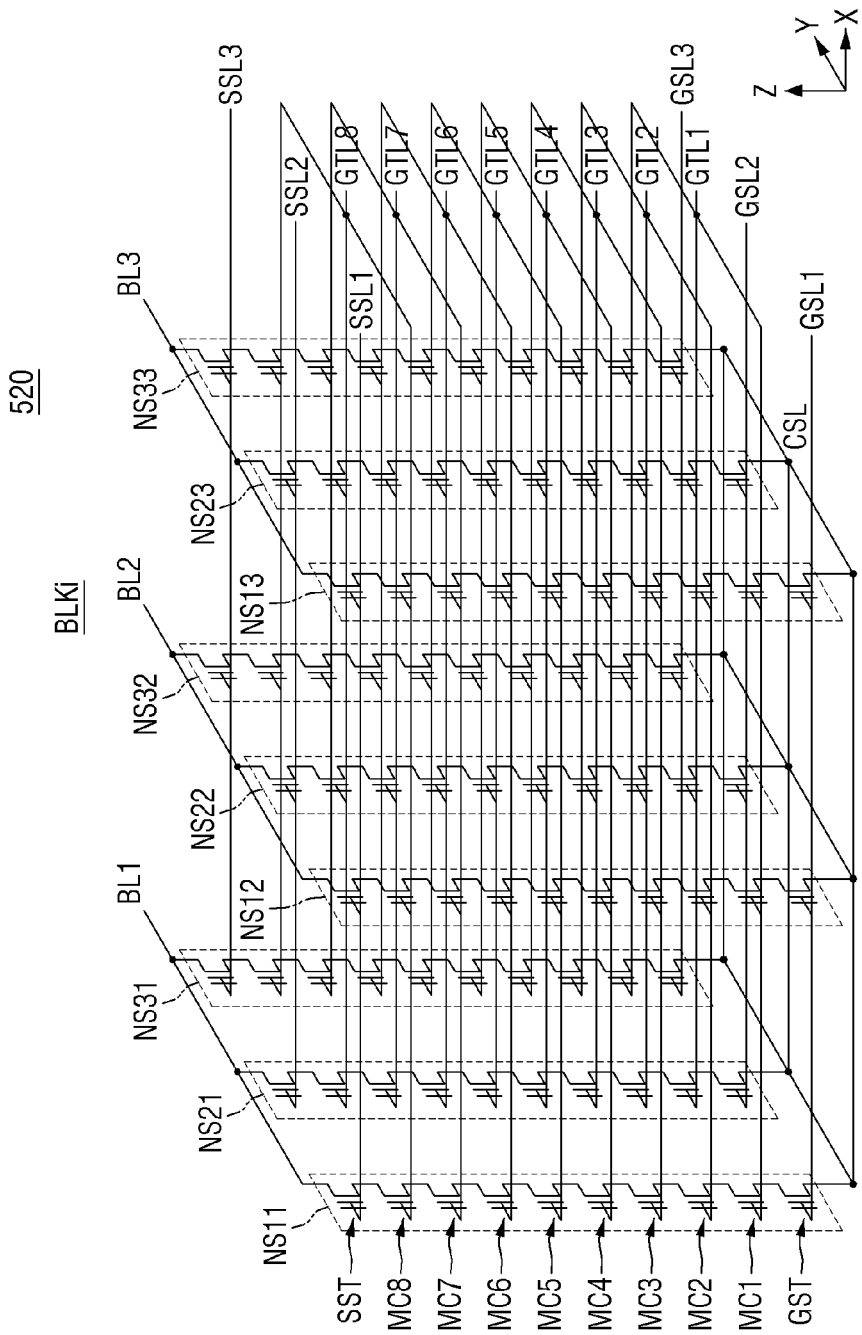
FIG. 7 is a diagram for explaining a 3DV-NAND structure which may be applied to the nonvolatile memory according to some embodiments.

FIG. 7 is a diagram for explaining a 3D V-NAND structure that may be applied to the nonvolatile memory according to some embodiments. When the storage module of the storage device is implemented as the 3D V-NAND type flash memory, each of the plurality of memory blocks constituting the storage module may be expressed as an equivalent circuit as shown in FIG. 7.

A memory block BLKi shown in FIG. 7 shows a three-dimensional memory block formed on the substrate in a three-dimensional structure. For example, a plurality of memory NAND strings included in the memory block BLKi may be formed in a direction perpendicular to the substrate.

Referring to FIG. 7, the memory block BLKi may include a plurality of memory NAND strings NS11 to NS31, NS12 to NS32, and NS13 to NS33 connected between the bit lines BL1, BL2 and BL3 and the common source line CSL. A plurality of memory NAND strings NS11 to NS31, NS12 to NS32, and NS13 to NS33 may each include a string selection transistor SST, a plurality of memory cells MC1, MC2, ..., and MC8, and a ground selection transistor GST. Although FIG. 7 shows that each of the plurality of memory NAND strings NS11 to NS31, NS12 to NS32, and NS13 to NS33 includes eight memory cells MC1, MC2, ..., and MC8, the embodiment is not necessarily limited thereto.

The string selection transistor SST may be connected to the corresponding string selection lines SSL1, SSL2, and SSL3. The plurality of memory cells MC1, MC2, ..., and MC8 may each be connected to the corresponding gate lines GTL1, GTL2, ..., and GTL8. The gate lines GTL1, GTL2, ..., and GTL8 may correspond to word lines, and some of the gate lines GTL1, GTL2, ..., and GTL8 may correspond to dummy word lines. The ground selection transistor GST may be connected to the corresponding ground selection lines GSL1, GSL2, and GSL3. The string selection transistor SST may be connected to the corresponding bit lines BL1, BL2 and BL3, and the ground selection transistor GST may be connected to the common source line CSL.

The word lines (e.g., WL1) of the same height are connected in common, and the ground selection lines GSL1, GSL2 and GSL3 and the string selection lines SSL1, SSL2 and SSL3 may be separated from each other. Although FIG. 7 shows that the memory block BLKi is connected to eight gate lines GTL1, GTL2, ..., and GTL8 and three bit lines BL1, BL2 and BL3, the embodiment is not necessarily limited thereto.

Hereinafter, the operation of storing the history log will be described referring to FIGS. 1 and 8 to 15.

Figure 8:
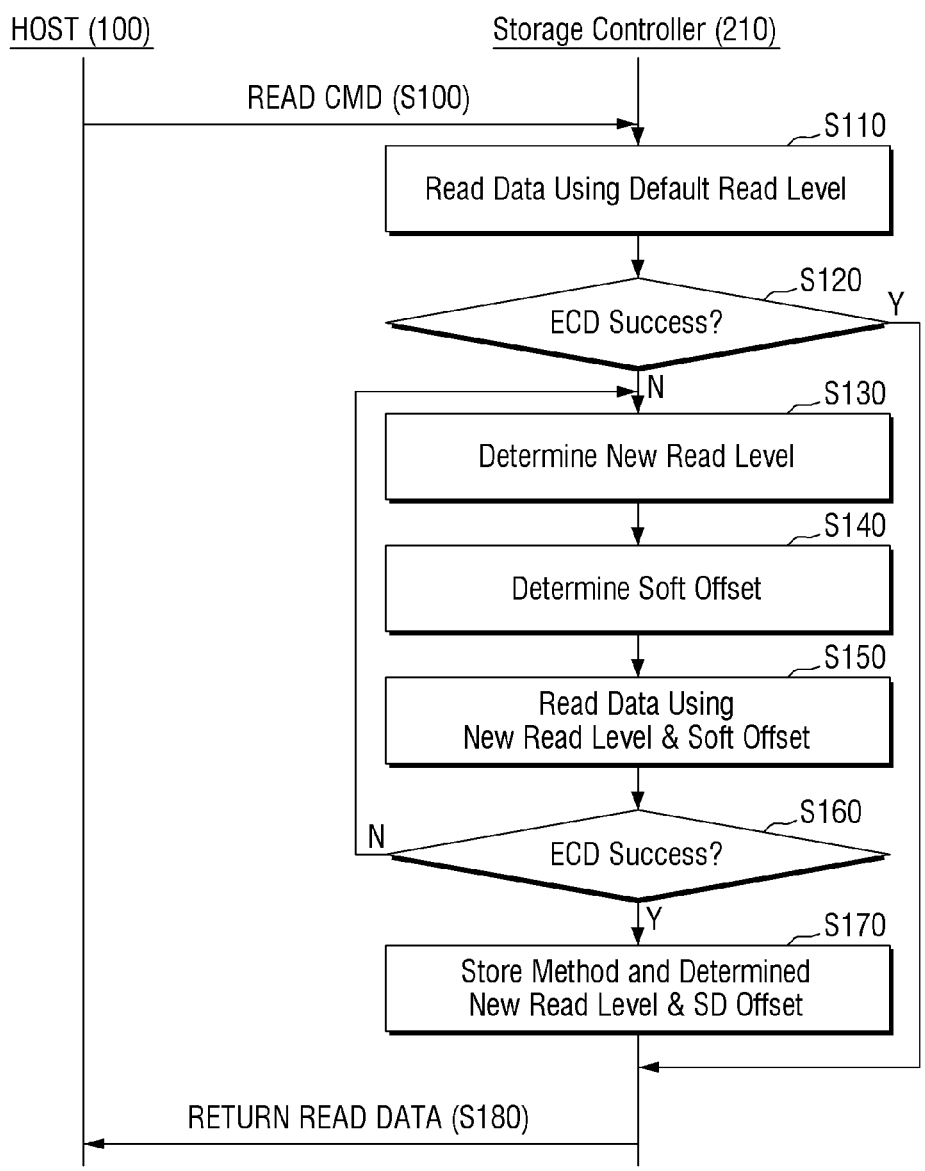
FIG. 8 is a diagram for explaining the operation of the storage device according to some embodiments.

FIG. 8 is a diagram for explaining the operation of the storage device according to some embodiments. FIGS. 9 to 15 are diagrams for explaining the operation of FIG. 8 according to example embodiments.

Referring to FIGS. 1 and 8, the host device 100 transmits a read command to the storage controller 210 (S100).

The storage controller 210 to which the read command is provided from the host device 100 reads the data stored in the nonvolatile memory 220, using a default read level (S110).

Here, the default read level is a read level predetermined by the storage controller 210, but is not a value included in the history log (216a of FIG. 2) stored in the buffer memory 216. For example, the nonvolatile memory 220 may store the default read level and the storage controller 210 may read the default read level from the nonvolatile memory 220 when the storage controller 210 is detected power up in booting. The storage controller 210 may also store the default read level in the buffer memory 216 during the power up operation.

Next, the storage controller 210 receives read data (for example, hard decision data) obtained by reading the data stored in the nonvolatile memory 220 using the default read level, and provides this to the ECC engine 217. The ECC engine 217 performs error correction decoding (ECD) on the input read data, and when the error correction decoding succeeds (S120-Y), the storage controller 210 transmits the data subjected to error correction decoding to the host 100 in response to the read command (S180).

If the error correction decoding fails (S120-N), the storage controller 210 may determine a new read level corresponding to a cell distribution of the nonvolatile memory 220 (S130). For example, in step S130, the storage controller 210 may determine a new read level based on a current cell distribution of the nonvolatile memory 220. Next, the storage controller 210 may determine the soft decision offset (SD Offset) value of the new read level (S140) and read the data stored in the nonvolatile memory, using the determined new read level and soft decision offset value (S150). Next, the storage controller 210 may perform error correction decoding on the read data (e.g., soft decision data) whether the error correction decoding succeeds or fails (S160). The defense operation or the recovery operation may include the operation steps S130 to S160. And then, the storage controller 210 may store the determined new read level, a method used to determine the new read level, and the determined soft decision offset value in the buffer memory 216 of FIG. 1 as a history log (S170).

This will be explained below in more detail.

Figure 9:
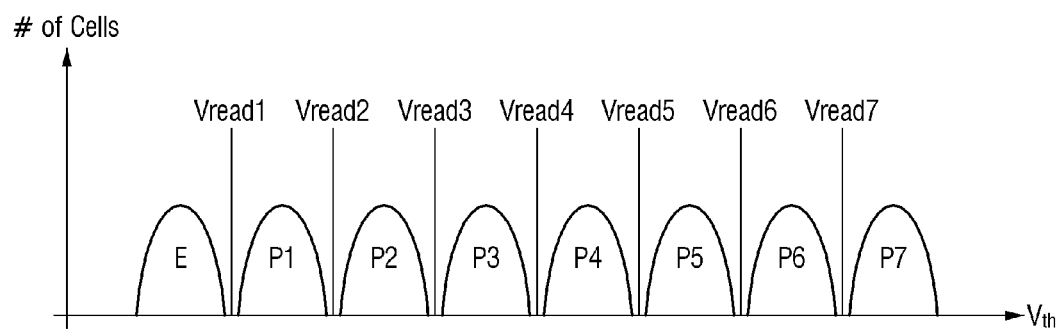
FIGS. 9 to 15 are diagrams for explaining the operation of FIG. 8 according to example embodiments.

FIG. 9 is a diagram showing cell distribution of ideal triple-level cell (TLC).

Referring to FIG. 9, in the case of a TLC memory capable of storing 3 bits in one memory cell of the nonvolatile memory 220, any one of eight threshold voltages Vth shown for programming 3 bits in one memory cell is formed in the memory cell. Incidentally, for example, since there is also a difference in electrical characteristics between memory cells programmed to P1, the threshold voltage of each of a plurality of memory cells programmed to the same P1 may form a certain range of a threshold voltage distribution as shown.

If the cell distribution of the nonvolatile memory 220 maintains the ideal state as shown in FIG. 9, when the read operation is performed using the default read levels Vread1 to Vread7 shown in FIG. 9, read data having no error may be received, and there is a high probability that error correction decoding succeeds (S120-Y).

That is, when the cell distribution of the memory cells of the nonvolatile memory 220 is the same as that shown in FIG. 9, and the above-mentioned default read level is, for example, the read levels Vread1 to Vread7 shown in FIG. 9, there is a high possibility that error correction decoding succeeds (S120-Y).

Incidentally, the cell distribution may deteriorate as the operation of the nonvolatile memory 220 is repeated.

Figure 10:
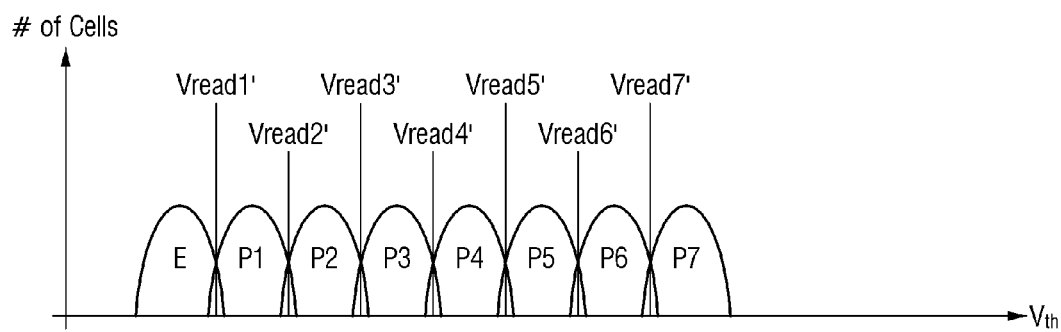

FIG. 10 is a diagram showing that the cell distribution of the TLC deteriorates.

Referring to FIG. 10, the threshold voltage distribution moves left and right depending on a charge loss generated by the emission of electrons stored in the memory cell of the nonvolatile memory 220 over time. As a result, the threshold voltage distributions of the erase state E and the seven program states P1 to P7 may overlap each other.

If the threshold voltage distributions overlap in this way, a UECC error due to many error bits may occur when the read operation is performed using the default read levels Vread1 to Vread7.

That is, when reading using the read level Vread1, it is necessary to distinguish between an on-cell which is a left erase state E and an off-cell which is a right state P1. However, when the cell distributions of the memory cell overlap as shown in FIG. 10, there are memory cells that are read as the off-cell even though the actual state is the on-cell, and there are memory cells that are read as the on-cell even though the actual state is the off-cell.

Therefore, when cell distribution is as shown in FIG. 10, if the read operation is performed using the default read levels Vread1 to Vread7, because read data with many errors are received, there is a probability that error correction decoding fails (S120-N).

Therefore, if the error correction decoding fails (S120-N), the storage controller 210 determines new read levels (e.g., Vread1' to Vread7') that is different from the default read levels (e.g., Vread1 to Vread7) that may reflect the cell distribution of the nonvolatile memory 220 (S130).

Figure 11:
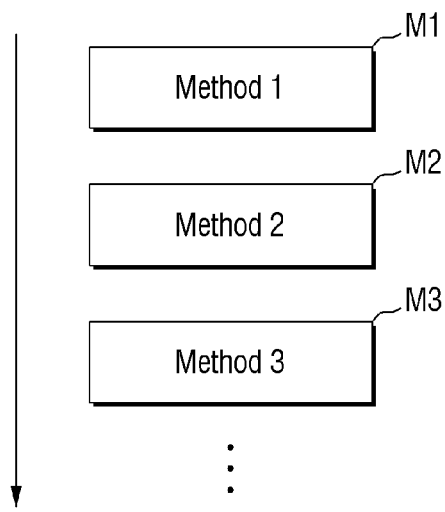

Referring to FIG. 11, the storage controller 210 may determine a new read level, using predetermined methods for determining a new read level that reflects the distribution of memory cells of the nonvolatile memory 220.

For example, the storage controller 210 may use a first method M1 which determines a first new read level by inputting distribution information of memory cells of the nonvolatile memory 220 into a predetermined formula to determine the first new read level. Further, the storage controller 210 may use a second method M2 which determines a second new read level, using distribution information of adjacent memory cells of the nonvolatile memory 220. Further, the storage controller 210 may use a third method M3 which determines a third new read level, while shifting a read level.

In some embodiments, the storage controller 210 may sequentially apply the first method M1 to the third method M3. For example, if the data which is read using the first new read level determined using the first method M1 fails in error correction decoding, the storage controller 210 may determine the second new read level, using the second method M2. Further, when the data which is read using the second new read level determined using the second method M2 fails in error correction decoding, the storage controller 210 may determine the third new read level, using the third method M3.

Next, referring to FIG. 8, the storage controller 210 determines the soft decision offset (SD Offset) value of the new read level (S140 of FIG. 8).

Figure 12:
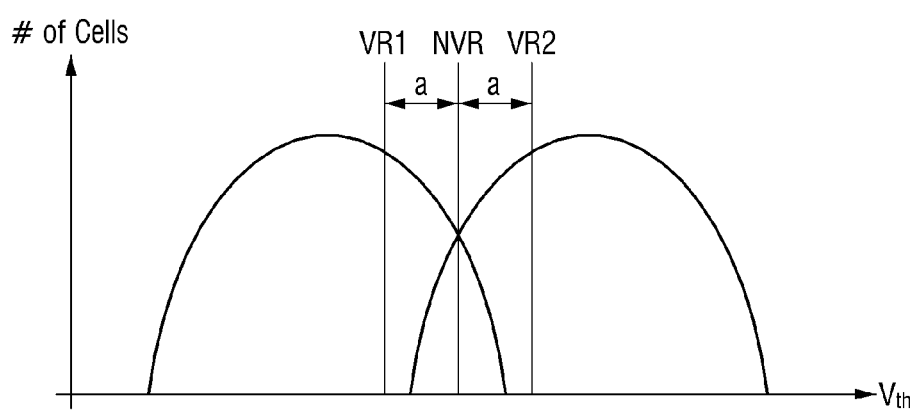

Referring to FIG. 12, the soft decision offset value "a" is an offset value that is applied to a new read level NVR to generate the soft decision data. Read levels VR1 and VR2 for generating the soft decision data may be determined by the soft decision offset value "a". Herein, the unit of "a" may be mV.

Figure 13:
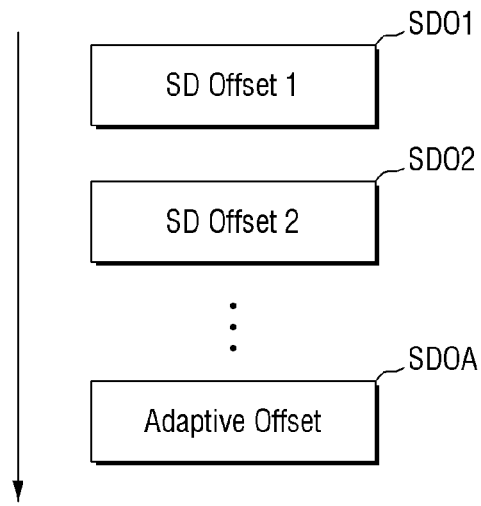

Referring to FIG. 13, the storage controller 210 may determine a soft decision offset value by selecting any one of a plurality of soft decision offset values. Here, a soft decision offset value SDO1 may be a first fixed value, and a soft decision offset value SDO2 may be a second fixed value different from the first fixed value. For example, although the first fixed value may be 10 mV and the second fixed value may be 20 mV, the embodiments are not limited thereto.

In some embodiments, the storage controller 210 may determine an adaptive soft decision offset value SDOA. In this case, the storage controller 210 may perform a read operation including a cell count to determine the soft decision offset value.

Figure 14:
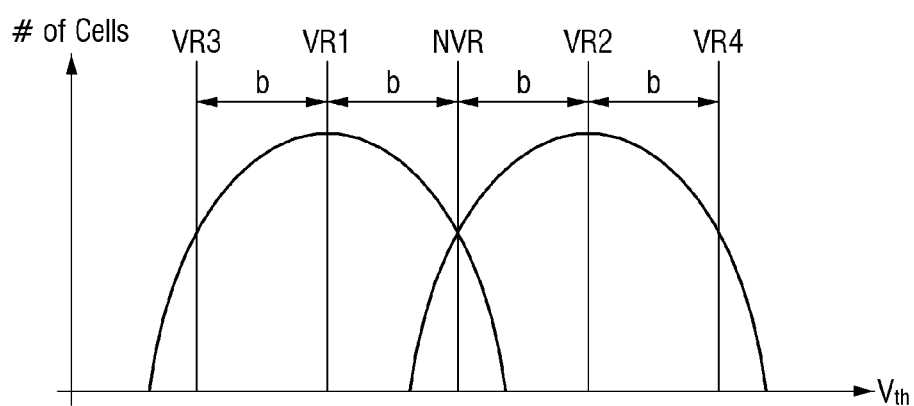

Referring to FIG. 14, the storage controller 210 may count the number of memory cells corresponding to the on-cell and the number of memory cells corresponding to the off-cell at a read level VR1 in which an offset "b" as a predetermined fixed value (e.g., 80 mV) is applied to a new read level NVR, and may count the number of memory cells corresponding to the on-cell and the number of memory cells corresponding to off-cells at a read level VR2 in which a predetermined offset "b" is applied to the new read level NVR.

Further, the storage controller 210 may count the number of memory cells corresponding to on-cell and the number of memory cells corresponding to off-cell at a read level VR3 in which a predetermined offset "2b" is applied to the new read level NVR, and may count the number of memory cells corresponding to the on-cell and the number of the memory cells corresponding to the off-cell at a read level VR4 in which the predetermined offset "2b" is applied to the new read level NVR.

Since such a cell count result provides information about the cell distribution of the current nonvolatile memory 220, the storage controller 210 may determine the most appropriate soft decision offset value that is suitable for the current cell distribution on the basis of such a cell count result. For example, the storage controller 210 may determine the soft decision offset value (e.g., SDOA of FIG. 13) as "b" or "2b" depending on the cell count result.

Referring to FIG. 8 again, the storage controller 210 reads the data stored in the nonvolatile memory, using the determined new read level and soft decision offset value (S150). Accordingly, the storage controller 210 may receive the soft decision data.

Hereinafter, the hard decision read operation and the soft decision read operation will be described referring to FIG. 15.

The hard decision read operation reads the data stored in the memory cell as 1 or 0, depending on whether the memory cell is the on-cell or the off-cell, when the voltage having the read level is applied to the word line (WL of FIG. 6) of the memory cell.

Figure 15:
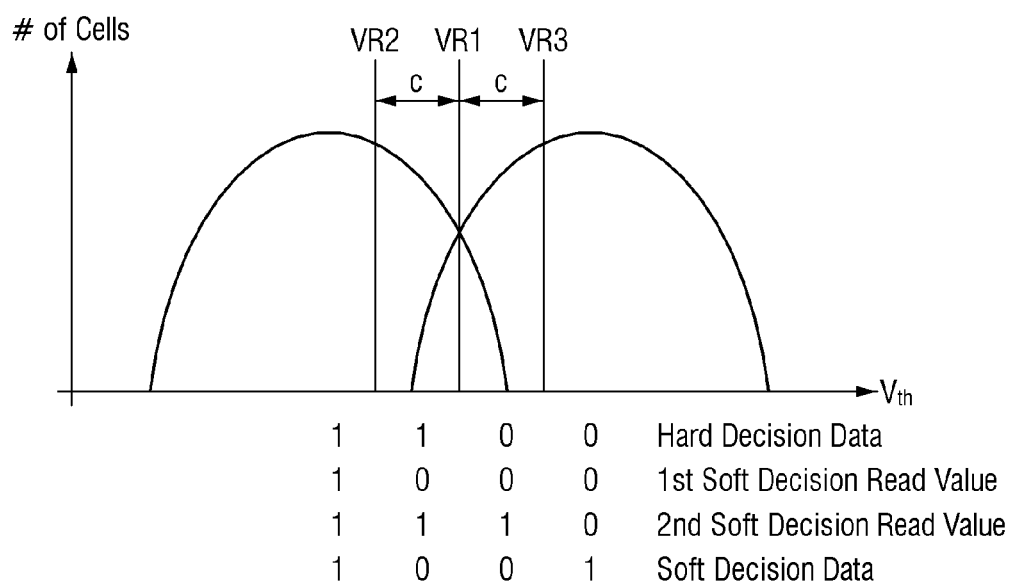

In FIG. 15, the hard decision read level is VR1. Here, VR1 is a read level determined through the method (any one of the first to third methods M1 to M3 of FIG. 11) previously determined through step S130 of FIG. 8. When the VR1 is applied to the memory cell through the word line, the hard decision data becomes 1 if the memory cell is the on-cell, and the hard decision data becomes 0 if the memory cell is the off-cell. FIG. 15 shows, as an example, that the hard decision data is set to 1, 1, 0, 0 by determining the voltage level located on the left side as on (1), and determining the voltage level located on the right side as off (0) on the basis of the hard decision read level VR1.

On the other hand, the read operation of step S110 described above may be, for example, such a hard decision read operation, and thus, the storage controller 210 may receive the hard decision read data as a result of the step S110.

The soft decision read operation reads whether the memory cell is on or off, using at least one or more read voltages having a constant difference (e.g., soft decision offset) on the basis of the hard decision read level VR1.

In FIG. 15, the soft decision read levels are VR2 and VR3. Such VR2 and VR3 may be determined by the soft decision offset value "c" determined in step S140 of FIG. 8. Herein, the unit of "c" may be mV. Here, VR2 is referred to as a first soft decision read level, and VR3 is referred to as a second soft decision read level. The first soft decision read level VR2 may be smaller than the hard decision read level VR1 by the soft decision offset value "c" determined in step S140, and the second soft decision read level VR3 may be greater than the hard decision read level VR1 by the soft decision offset value "c" determined in step S140.

As shown in FIG. 15, the first soft decision read values determined by applying the first soft decision read level VR2 to the word line are 1, 0, 0, 0, and the second soft decision read values determined by applying the second soft decision read level VR3 to the word line are 1, 1, 1, 0.

Soft decision data may be generated on the basis of the first and second soft decision read values. In some embodiments, the soft decision data may be data generated by performing an XNOR calculation of the first and second soft decision read values each other. As a result of performing the XNOR calculation on the first and second soft decision read values obtained above, the soft decision data may be generated as 1, 0, 0, 1.

Such soft decision data may add reliability to the hard decision data. That is, if the soft decision data is 1, it may mean that the hard decision data has a strong reliability, and if the soft decision data is 0, it may mean that the hard decision data has a weak reliability.

Next, referring to FIG. 8, the storage controller 210 receives the soft decision data and provides it to the ECC engine 217. The ECC engine 217 performs error correction decoding on the input soft decision data, and if the error correction decoding fails (S160-N), the storage controller 210 repeats determination of new read level and new soft decision offset value, until the error correction decoding succeeds. For example, the storage controller 210 may repeat determination of new read level and new soft decision offset value in order until a predetermined sequence is finished. Even though not shown in FIG. 8, the storage controller 210 may exit the recovery operation and send read failure information to the host 100 when the error correction decoding is failed and the predetermined sequence is finished.

For example, in the first attempt, the storage controller 210 determines the read level by the first method (M1 of FIG. 11), reads the data by the soft decision offset value (SDO1 of FIG. 13) of the determined read level, and then, performs the error correction decoding. However, if the error correction decoding fails, in a second attempt, the storage controller 210 determines the read level by the first method (M1 of FIG. 11), reads the data by the soft decision offset value (SDO2 of FIG. 13) of the determined read level, and then, may perform the error correction decoding.

Further, even in the second attempt, if the error correction decoding fails, the storage controller 210 may determine the read level by the first method (M1 of FIG. 11), read the data by the adaptive soft decision offset value (SDOA of FIG. 13) of the determined read level, and then perform error correction decoding. Alternatively, the storage controller 210 may determine the read level by the second method (M2 of FIG. 11), read the data by the soft decision offset value (SDO1 of FIG. 13) of the determined read level, and then perform the error correction decoding.

Such an operation procedure may be predetermined by a firmware that controls the storage controller 220 or the like.

If the error correction decoding succeeds (S160-Y), the history log manager 219 of the storage controller 210 stores, for example, a determined new read level, a method (e.g., any one of the first to third methods M1 to M3 of FIG. 11) used to determine the new read level, and the determined soft decision offset value (e.g., any one of the soft decision offset values SDO1, SDO2, and SDOA of FIG. 13) in the buffer memory 216 as a history log (S170). Further, the storage controller 210 transmits the error-corrected and decoded data to the host device 100 in response to a read command (S180).

In accordance with this operation, the buffer memory (216 of FIG. 2) according to this embodiment stores and maintains the method used to determine the new read level which succeeds in the error correction decoding most recently, and the determined soft decision offset value as the history log (216a of FIG. 2). If the cell distribution of the nonvolatile memory 220 does not change abruptly, the method used to determine the new read level that succeeds in the error correction decoding most recently, and the determined soft decision offset value may be considered as the method and the offset value that may be best suitable for the current cell distribution of the memory cell.

In this embodiment, the history log (216a of FIG. 2) does not include the method used to determine the new read level that was successful in the error correction decoding past, and the determined soft decision offset values.

The method used to determine the new read level that was successful in the error correction decoding in the past and the determined soft decision offset values are hard to consider to adequately reflect the current cell distribution of the memory cells. Incidentally, to retain the past information, a storge space of the buffer memory (216 of FIG. 1) in which the history log (216a of FIG. 2) is stored needs to increase. Therefore, in the present embodiment, the past information may be not stored so that the storage space of the buffer memory (216 of FIG. 1) may be minimized.

Hereinafter, the operation of using the history log will be described referring to FIGS. 1 and 16 to 18.

Figure 16:
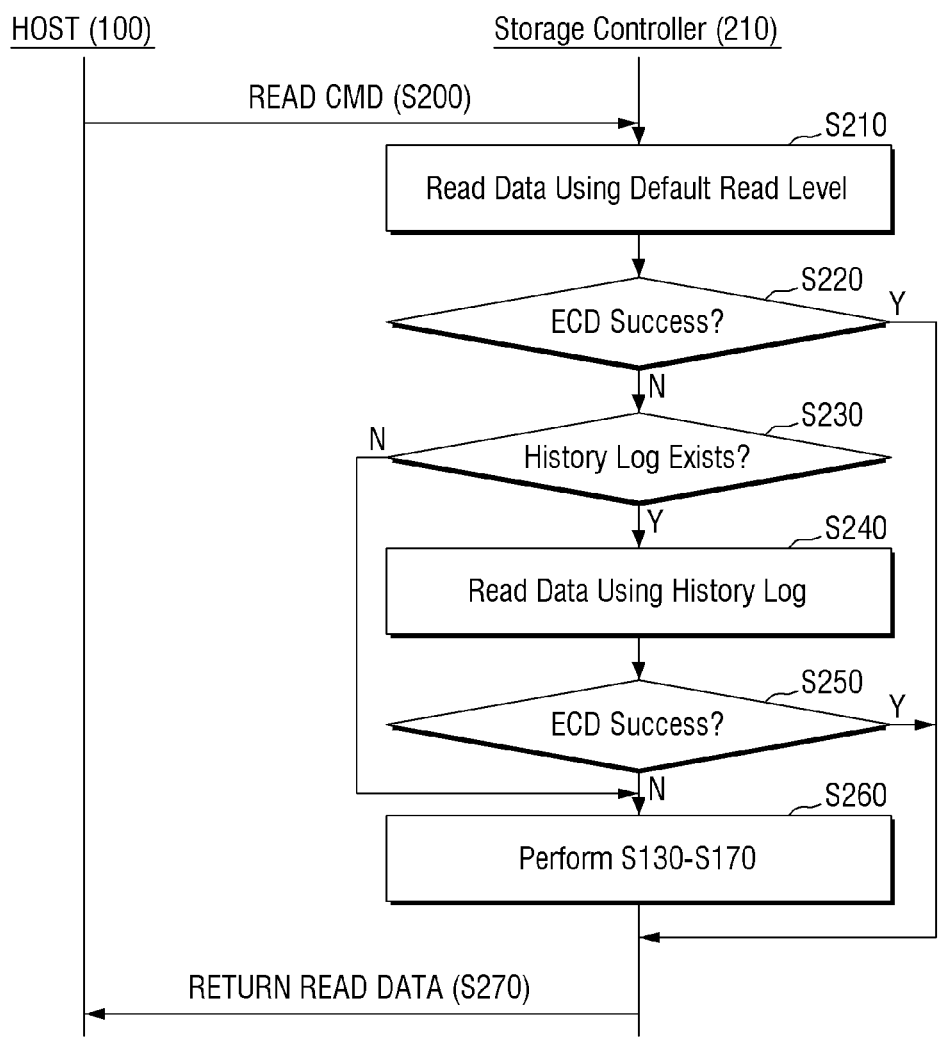
FIG. 16 is a diagram for explaining the operation of the storage device according to some embodiments.
Figure 17:
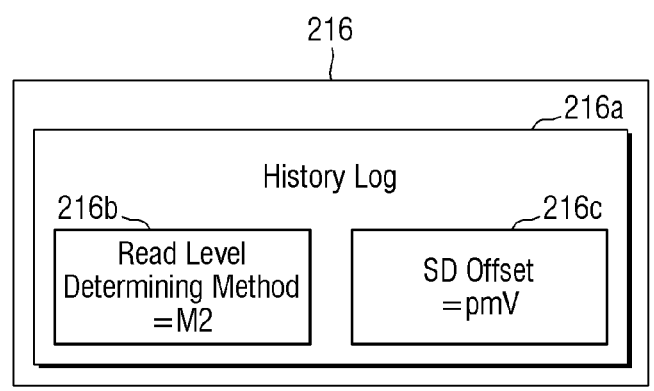
FIGS. 17 and 18 are diagrams for explaining the operation of FIG. 16 according to example embodiments.
Figure 18:
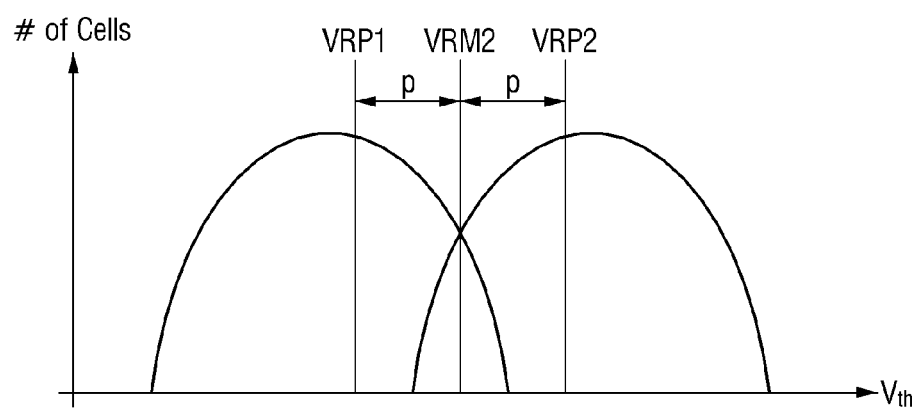

FIG. 16 is a diagram for explaining the operation of the storage device according to some embodiments. FIGS. 17 and 18 are diagrams for explaining the operation of FIG. 16 according to example embodiments.

Referring to FIGS. 1 and 16, the host device 100 may transmit a read command to the storage controller 210 (S200).

In some embodiments, the transmitted read command may be a read command that directly follows the read command provided from the host device 100 in step S100 of FIG. 8, but the embodiments are not limited thereto.

The storage controller 210 to which the read command is provided from the host device 100 reads the data stored in the nonvolatile memory 220, using the default read level (S210).

Here, the default read level may be the same read level as the read level that is predetermined by the storage controller 210 in step S110 of FIG. 8, but is not a value which is stored as the history log (216a of FIG. 2) of the buffer memory 216. For example, the storage controller 210 may execute the step S210 without referring to the history log (216a of FIG. 2).

Next, the storage controller 210 receives read data (for example, hard decision data) obtained by reading data stored in the nonvolatile memory 220 using the default read level, and provides this to the ECC engine 217. The ECC engine 217 performs error correction decoding (ECD) on the input read data, and if the error correction decoding succeeds (S220-Y), the storage controller 210 transmits the data subjected to error correction decoding to the host device 100 in response to the read command (S270).

If the error correction decoding fails (S220-N), the storage controller 210 checks whether the history log exists (S230).

If there is no history log (S230-N), the storage controller 210 may perform the steps S130 to S170 of FIG. 8 (S260).

The operation performed in step S260 is the same as the operation previously performed in the steps S130 to S170 of FIG. 8. Therefore, repeated explanation will not be provided.

If the history log exists (S230-Y), the storage controller 210 determines the new read level by the method (e.g., any one of the first to third methods M1 to M3 of FIG. 11) used to determine the new read level stored as the history log, and reads the data stored in the nonvolatile memory, using the soft decision offset value (e.g., any one of the soft decision offset values SDO1, SDO2, and SDOA of FIG. 13) stored as the history log (S240).

For example, as shown in FIG. 17, when the method M2 is stored as a read level determining method 216b for determining a new read level, and "p" is stored as a soft decision offset value 216c in the history log 216a of the buffer memory 216, the storage controller 210 may determine the read level VRM2 shown in FIG. 18 by the method M2. Herein, the unit of p may be mV. Further, the storage controller 210 may determine the read levels VRP1 and VRP2 for the soft decision read, using the soft decision offset value "p", and may perform the soft decision read. Accordingly, the storage controller 210 may receive the soft decision data.

Next, the storage controller 210 receives the soft decision data and provides it to the ECC engine 217. The ECC engine 217 performs the error correction decoding on the input soft decision data, and if the error correction decoding fails (S250-N), the storage controller 210 determines a new read level and a soft decision offset value corresponding to the current cell distribution of the nonvolatile memory 220 (S260).

If the error correction decoding succeeds (S250-Y), the storage controller 210 transmits the data subjected to error correction decoding to the host device 100 in response to the read command (S270).

Because the method for determining the adaptive soft decision offset value SDOA described above determines the soft decision offset value by checking the cell distribution in real time while the nonvolatile memory 220 is operating, there is an advantage that unnecessary additional read operations (e.g., repetition from S130 to S160 of FIG. 8) can be minimized.

However, as described referring to FIG. 14, because additional read operations are required in the process of determining the soft decision offset value, the operations may adversely affect the operating speed of the storage device. In the present embodiment, because the success probability of error correction decoding can be enhanced through the information maintained as the history log, the operating speed of the storage device can be improved.

In concluding the detailed description, those skilled in the art will appreciate that many variations and modifications may be made to the preferred embodiments without substantially departing from the principles of the present invention. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A method for operating a storage controller, the method comprising:
receiving a first read command from a host device;
when the first read command is received, performing a first read of data stored in a nonvolatile memory using a first read level and receiving a first read data from the nonvolatile memory on the basis of a result of the first read;
performing first error correction decoding of the first read data to determine whether the first error correction decoding succeeds;
when the first error correction decoding is failed, determining a second read level different from the first read level using a procedure predetermined for the storage controller, and determining a first soft decision offset value of the second read level;
performing a second read of the data stored in the nonvolatile memory using the determined second read level and the first soft decision offset value and receiving a first soft decision data from the nonvolatile memory on the basis of a result of the second read;
performing second error correction decoding of the first soft decision data to determine whether the second error correction decoding succeeds; and
when the second error correction decoding is succeeded, storing the second read level, the procedure predetermined for the storage controller used to determine the second read level and the first soft decision offset value as a history log,
wherein the procedure predetermined for the storage controller is one of a set of procedures predetermined for the storage controller.

2. The method of claim 1, wherein the first read level is predetermined.

3. The method of claim 2, wherein the first read data includes a hard decision data.

4. The method of claim 1, wherein the determining of the first soft decision offset value of the second read level includes:
applying a predetermined offset to the second read level to perform the second read, and
determining the first soft decision offset value on the basis of a result of the second read.

5. The method of claim 4, wherein the applying of the predetermined offset to the second read level to perform the second read includes:
counting the number of memory cells corresponding to on-cell and the number of memory cells corresponding to off-cell, among memory cells included in the nonvolatile memory, by applying the predetermined offset to the second read level.

6. The method of claim 1, wherein the performing of the first error correction decoding includes the first error correction decoding using a low density parity check (LDPC) code, and
wherein the performing of the second error correction decoding includes the second error correction decoding using the LDPC code.

7. The method of claim 1, wherein the procedure predetermined for the storage controller determines the second read level, using current cell distribution information of memory cells of the nonvolatile memory.

8. The method of claim 7, wherein the procedure predetermined for the storage controller is a first method, and wherein the set of procedures predetermined for the storage controller includes:
the first method for determining the second read level, using a predetermined formula,
a second method for determining the second read level, using distribution information of adjacent memory cells of the nonvolatile memory, and
a third method for determining the second read level, while shifting a read level.

9. The method of claim 1, further comprising:
receiving a second read command from the host device;
when the second read command is received, performing a third read of data stored in the nonvolatile memory using the first read level and receiving a third read data from the nonvolatile memory on the basis of a result of the third read;
performing a third error correction decoding of the third read data to determine whether the third error correction decoding succeeds; and
when the third error correction decoding is failed:
performing a fourth read of the data stored in the nonvolatile memory using the second read level and the first soft decision offset value stored as the history log and receiving a second soft decision data from the nonvolatile memory on the basis of a result of the fourth read, and
performing fourth error correction decoding of the second soft decision data to determine whether the fourth error correction decoding succeeds.

10. The method of claim 9, further comprising:
when the fourth error correction decoding is failed, determining a third read level different from the second read level using a procedure predetermined for the storage controller and determining a second soft decision offset value of the third read level.

11. A method for operating a storage controller, the method comprising:
receiving a first read command from a host device;
when the first read command is received, performing a first read of data stored in a nonvolatile memory using a first read level and receiving a first read data from the nonvolatile memory;
performing first error correction decoding of the first read data to determine whether the first error correction decoding succeeds;
when the first error correction decoding is failed, checking whether a procedure predetermined for the storage controller for determining a second read level different from the first read level, and a first soft decision offset value of the second read level are stored as a history log;
when the history log exists, performing a second read of the data stored in the nonvolatile memory using the determined second read level and the first soft decision offset value of the history log to receive a first soft decision data from the nonvolatile memory on the basis of a result of the second read; and
when the history log does not exist, determining a third read level different from the first read level using a procedure predetermined for the storage controller and determining a second soft decision offset value of the third read level, and performing a third read of the data stored in the nonvolatile memory using the determined third read level and the second soft decision offset value to receive a second soft decision data,
wherein the procedure predetermined for the storage controller is one of a set of procedures predetermined for the storage controller.

12. The method of claim 11, further comprising:
performing second error correction decoding of the first soft decision data to determine whether the second error correction decoding succeeds, in response to the second read level and the first soft decision offset value; and
performing third error correction decoding of the second soft decision data to determine whether the third error correction decoding succeeds, in response to the third read level and the second soft decision offset value.

13. The method of claim 11, wherein the performing of the first read of data stored in the nonvolatile memory using the first read level occurs before the checking of the history log.

14. The method of claim 13, wherein the first read data includes hard decision data.

15. The method of claim 11, wherein the determining of the second soft decision offset value of the third read level includes:
applying a predetermined offset to the third read level to perform the third read of the data stored in the nonvolatile memory, and
determining the second soft decision offset value on the basis of result of the third read.

16. The method of claim 15, wherein the applying of the predetermined offset to the third read level to perform the third read includes:
counting the number of memory cells corresponding to on-cell and the number of memory cells corresponding to off-cell, among memory cells included in the nonvolatile memory, by applying the predetermined offset to the third read level.

17. A storage device comprising:
a nonvolatile memory; and
a storage controller which includes a buffer memory, and controls an operation of the nonvolatile memory,
wherein the storage controller is configured to:
receive a first read command from a host device;
in response to the first read command, perform a first read of data stored in the nonvolatile memory using a first read level and receive a first read data from the nonvolatile memory on the basis of a result of the first read;
perform error correction decoding of the first read data to determine whether the error correction decoding succeeds;
in response to failure of the error correction decoding, check whether a procedure predetermined for the storage controller for determining a second read level different from the first read level, and a first soft decision offset value of the second read level are stored as a history log;
in response to existing the history log, perform a second read of the data stored in the nonvolatile memory using the determined second read level and the first soft decision offset value to receive a first soft decision data from the nonvolatile memory on the basis of a result of the second read; and
in response to not existing the history log, determine a third read level different from the first read level using a procedure predetermined for the storage controller and determine a second soft decision offset value of the third read level, and perform a third read of the data stored in the nonvolatile memory using the determined third read level and the second soft decision offset value to receive a second soft decision data from the nonvolatile memory on the basis of a result of the third read,
wherein the procedure predetermined for the storage controller is one of a set of procedures predetermined for the storage controller.

18. The storage device of claim 17, wherein the storage controller is configured to apply a predetermined offset to the third read level to perform the third read, and determine the second soft decision offset value on the basis of result of the third read.

19. The storage device of claim 18, wherein the storage controller is configured to count the number of memory cells corresponding to on-cell and the number of memory cells corresponding to off-cell, among memory cells included in the nonvolatile memory, by applying the predetermined offset to the third read level.

20. The storage device of claim 17, wherein the storage controller further includes an error correction code (ECC) engine configured to perform the error correction decoding, using a low density parity check (LDPC) code.

* * * * *